United States Patent [19]
Ushiki et al.

[11] Patent Number: 5,217,107
[45] Date of Patent: Jun. 8, 1993

[54] APPARATUS FOR FEEDING PLATE-FORM PARTS

[75] Inventors: Hiroshi Ushiki, Saitama; Kazuo Sugiura, Tokyo, both of Japan

[73] Assignee: Kabushiki Kaisha Shinkawa, Tokyo, Japan

[21] Appl. No.: 855,297

[22] Filed: Mar. 23, 1992

[30] Foreign Application Priority Data

Mar. 22, 1991 [JP] Japan .................................. 3-83293

[51] Int. Cl.$^5$ ............................................. B65G 37/00
[52] U.S. Cl. ................................ 198/468.2; 198/803.3
[58] Field of Search ........................... 198/803.3, 468.2

[56] References Cited
U.S. PATENT DOCUMENTS 4,573,862  3/1986  Anderson ..................... 198/468.2 X
4,910,858  3/1990  Takeda et al. ................ 198/468.2 X

FOREIGN PATENT DOCUMENTS 60-67313  4/1985  Japan .

*Primary Examiner*—D. Glenn Dayoan
*Attorney, Agent, or Firm*—Koda and Androlia

[57] ABSTRACT

An apparatus for feeding plate-form parts such as lead frames used in, for example, semiconductor assembling machines including a plurality of frame feeder which have upper and lower claws for feeding the plate-form parts, a slider to which the frame feeder is mounted, a moving piece connected to the slider, a drive shaft screw-engaged with the moving piece, and a claw moving motor which rotates the drive shaft and therefore moves the moving piece. The feeding apparatus of this invention allows the drive shaft which moves the frame feeder to be shorter than in conventional apparatus so that each frame feeder can be fed with high precision.

2 Claims, 5 Drawing Sheets

APPARATUS FOR FEEDING PLATE-FORM PARTS

BACKGROUND OF THE INVENTION

1. Field of the Invention

The present invention relates to a feeding apparatus for plate-form parts such as lead frames, etc., and more particularly to a claw-drive mechanism used in such a feeding apparatus.

2. Prior Art

For example, the apparatus described in the Japanese Patent Application Laid-Open ("Kokai") No. 60-67313 is one of conventional plate-form part feeding apparatuses. In this prior art apparatus, respective female screws are fastened to frame feeder assemblies which have claws that feed lead frames, and these female screws are screw-engaged with a male screw.

In this apparatus, since female screws are fastened to frame feeder assemblies and screw-engaged with a male screw, an extremely long male screw is required. In addition, it is difficult to manufacture such a long male screw with high precision and to design the frame feeder assemblies with high precision.

The object of the present invention is to provide an apparatus for feeding plate-form parts such a lead frames in which a male screw or drive shaft which is shorter than a conventional male screw can be used so that a respective frame feeder assembly of the feeding apparatus can be moved precisely.

The object of the present invention is accomplished by a unique structure that includes (a) a plurality of frame feeder assemblies which have claws that are used to feed plate-form parts, (b) a slider to which the frame feeder assemblies are mounted, (c) a female screw (moving piece) connected to the slider, (d) a male screw (drive shaft) screw-engaged with the female screw (moving piece), and (e) a claw moving motor which rotates the male screw (drive shaft).

With such a structure, when the claw moving motor is rotated a fixed amount, the male screw (drive shaft) rotates and the slider moves a fixed distance together with the female screw (moving piece). As a result, the frame feeder assemblies attached to the slider also move a fixed distance.

Thus, since the frame feeder assemblies are mounted on the slider, and the moving piece is attached to this slider, the length of the drive shaft which moves the moving piece needs only to be as long as a fixed distance necessary for the frame feeder assemblies to be moved, i.e., as long as the feeding pitch of one plate-form part to be fed. In other words, since the drive shaft can be very short, the respective frame feeder assembly can be moved with high precision.

DETAILED DESCRIPTION OF THE INVENTION

One embodiment of the present invention will be described below with reference to the accompanying drawings.

Figure 1:
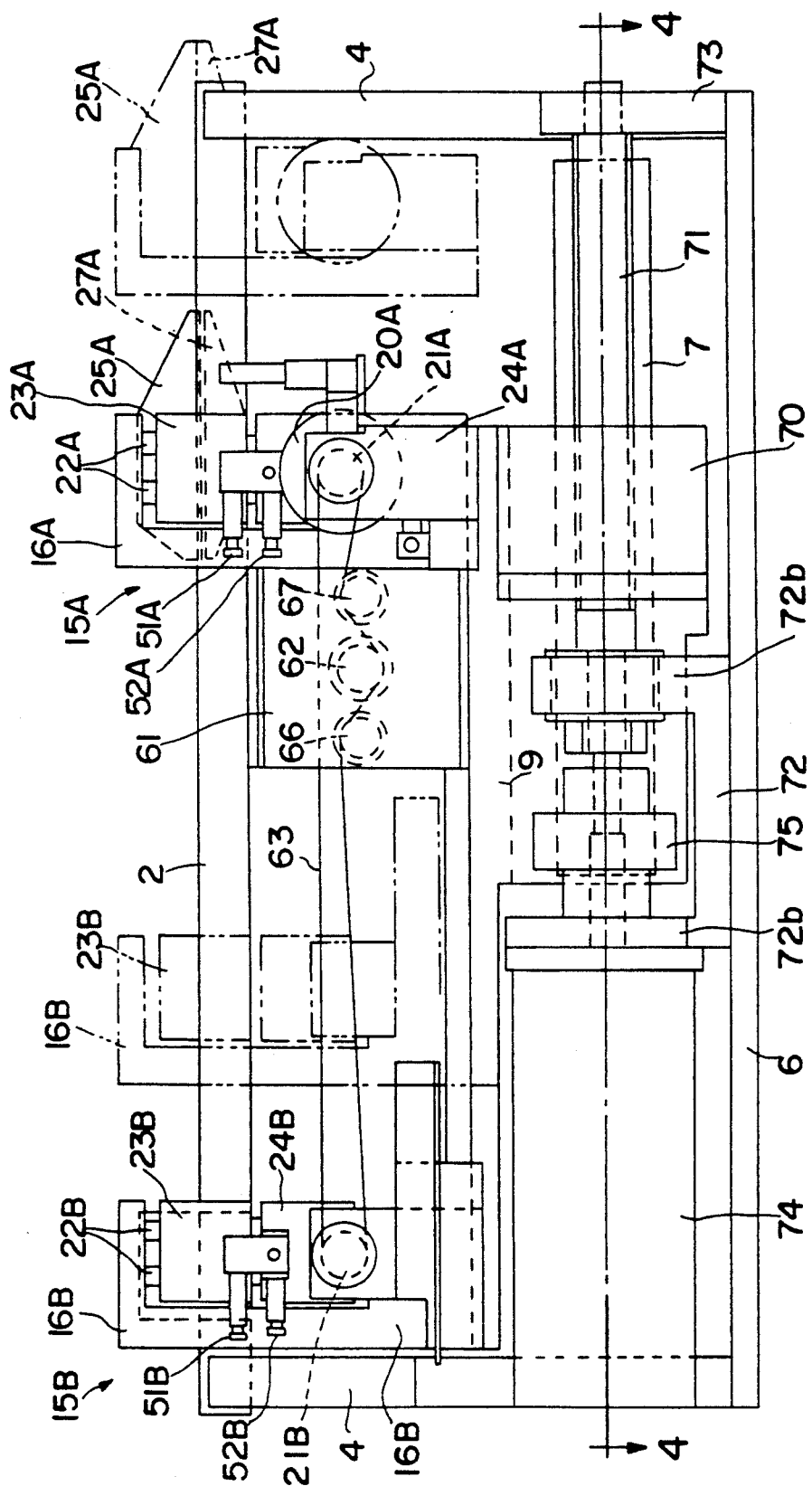
FIG. 1 is a front view of the feeding apparatus according to the present invention.
Figure 2:
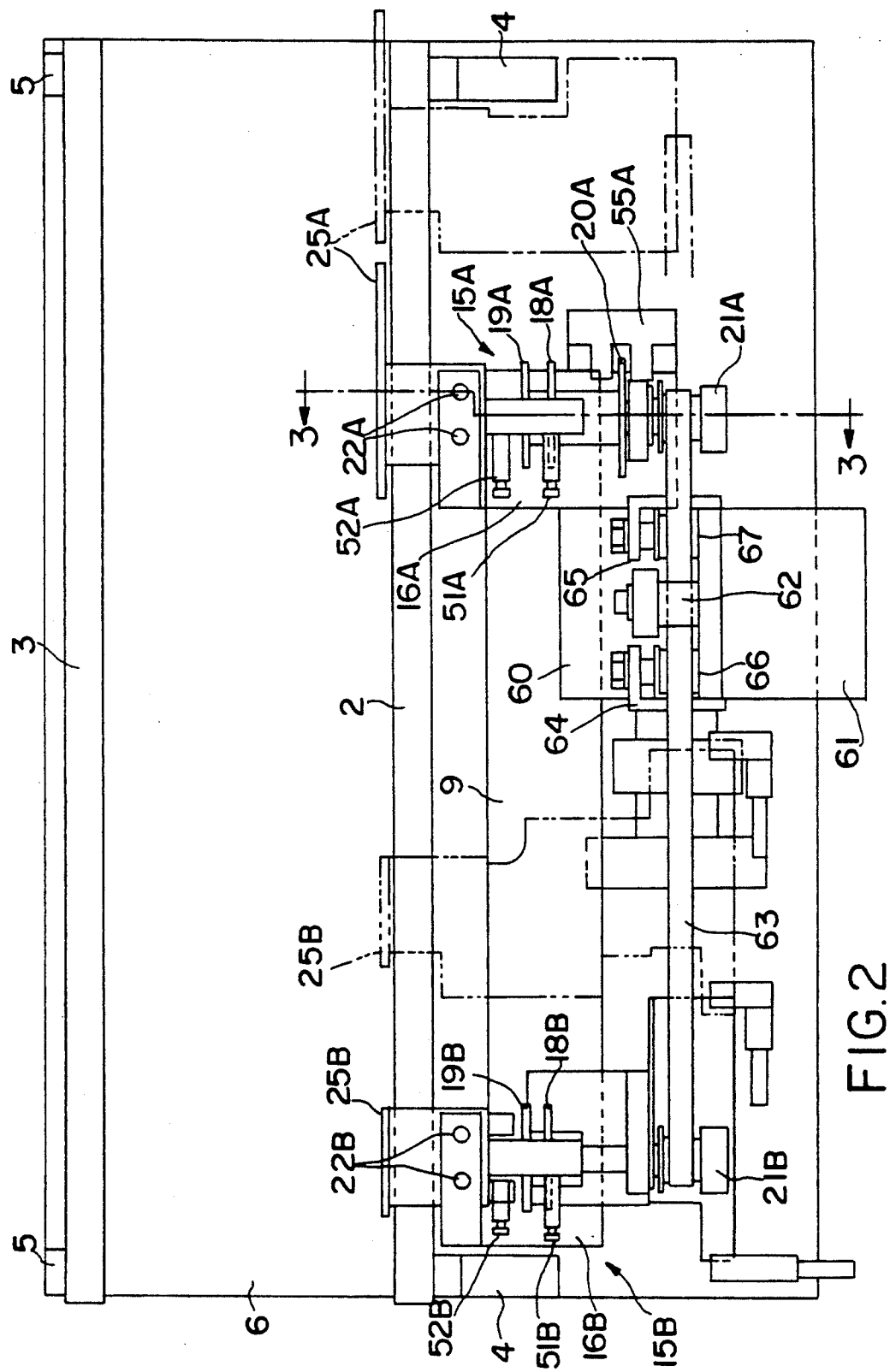
FIG. 2 is a top view thereof.
Figure 3:
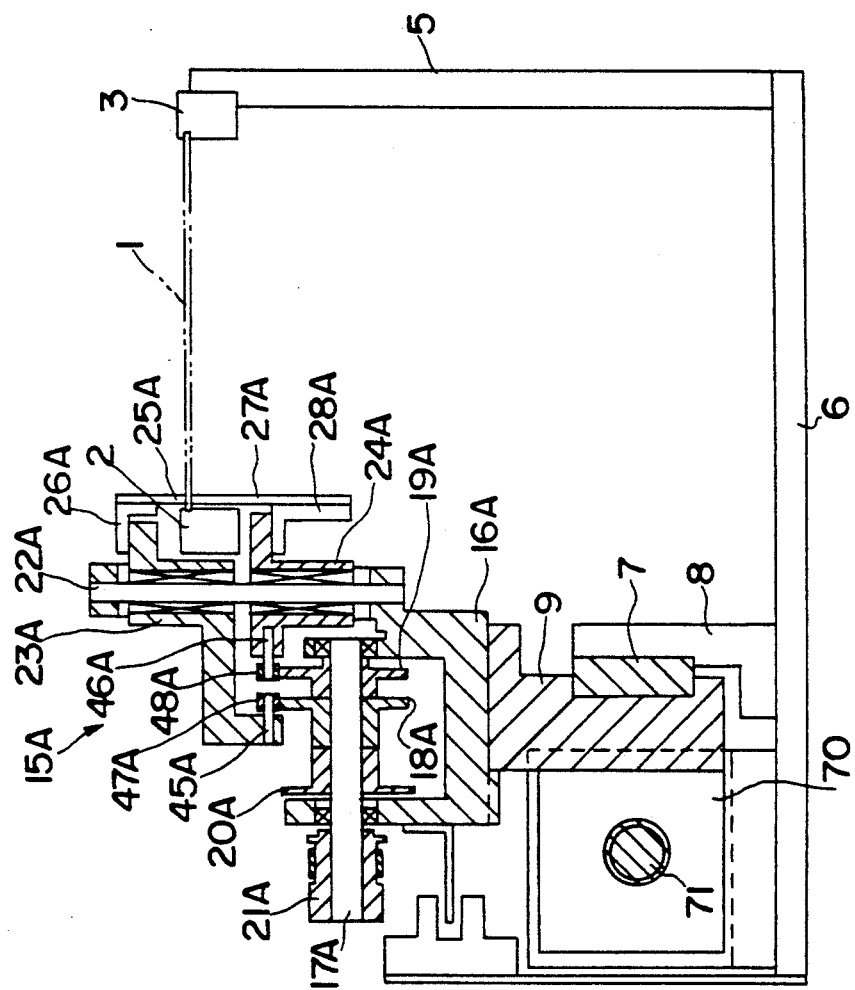
FIG. 3 is a cross section taken along the line 3—3 in FIG. 2.
Figure 4:
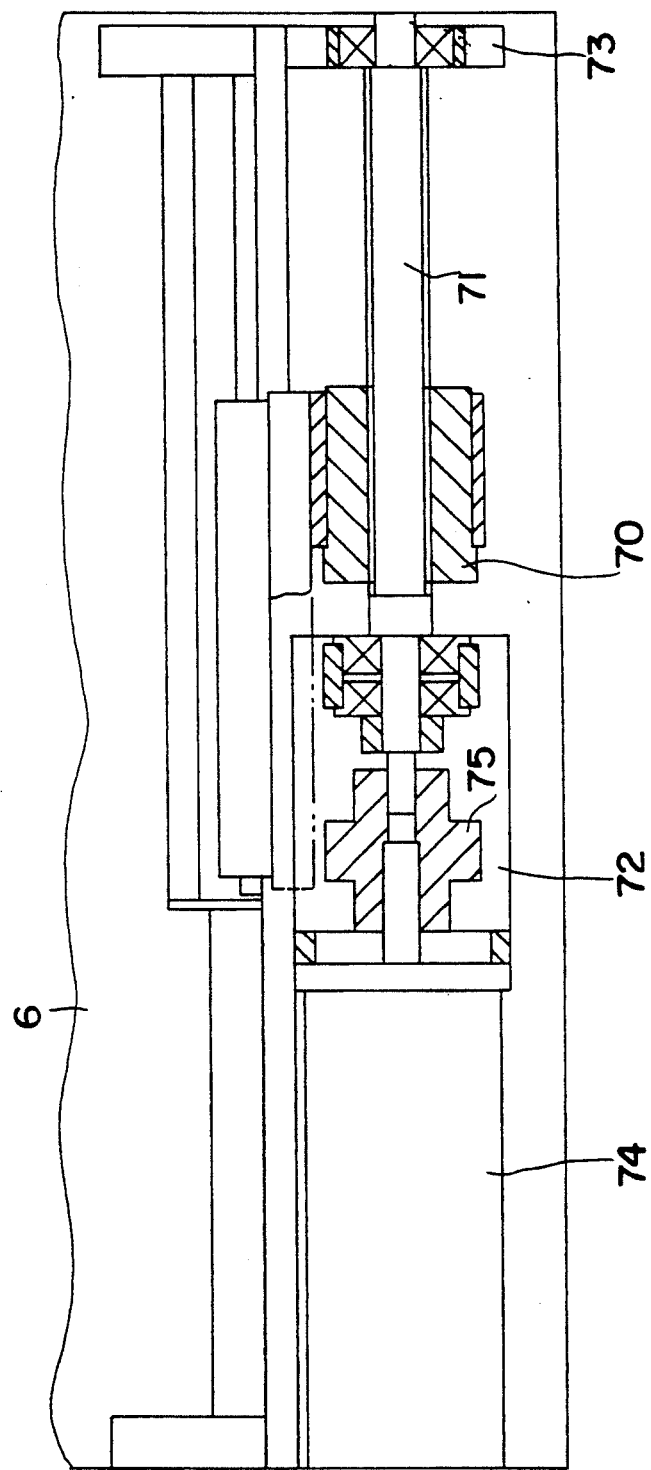
FIG. 4 is a cross section taken along the line 4—4 in FIG. 1.

As seen in FIG. 1, a pair of guide rails 2 and 3 (see particularly FIG. 3) which guide lead frames 1 are provided at both ends of a base plate 6 via supporting plates 4 and 5.

Guide plate 7 is installed beneath the guide rail 2 so as to be parallel to the guide rail 2. The guide plate 7 is provided on the base plate 6 via a vertical support 8. A slider 9 installed on the guide plate 7 is slidable along the guide plate 7.

First and second supporting blocks 16A and 16B for two frame feeder assemblies 15A and 15B are provided on the slider 9 with a fixed distance apart. The frame feeder assemblies 15A and 15B have substantially the same structure. Accordingly, only one frame feeding assembly 15A will be described below. Elements functioning the same are referred to by the same numbers, and an "A" or "B" is added to each reference number in order to distinguish between the two frame feeder assemblies.

A cam shaft 17A is rotatably supported on the supporting block 16A of the frame feeding assembly 15A. The cam shaft 17a is provided with an upper claw up/down cam 18A, a lower claw up/down cam 19A, a starting point detection cam 20A and a timing pulley 21A. In addition, two guide rods 22A are provided vertically on the supporting block 16A such that the guides rods 22A are above the cam shaft 17A.

An upper claw holder 23A and a lower claw holder 24A are provided so that they slide on the guide rods 22A. An upper claw 25A is mounted to the upper claw holder 23A via an upper claw fastening plate 26A, and a lower claw 27A is mounted to the lower claw holder 24A via a lower claw fastening plate 28A.

The upper claw 25A is located between the guide rails 2 and 3 and above the guide rails 2. The lower claw 27A is located between the guide rails 2 and 3 and beneath the guide rail 2. The lower claw 27A is directly beneath the upper claw 25A.

Roller supporting shafts 45A and 46A are respectively provided on the upper claw holder 23A and lower claw holder 24A, and rollers 47A and 48A are rotatably provided on the roller supporting shafts 45A and 46A. These rollers positionally correspond to the upper claw up/down cam 18A and the lower claw up/down cam 19A, respectively.

Figure 5:
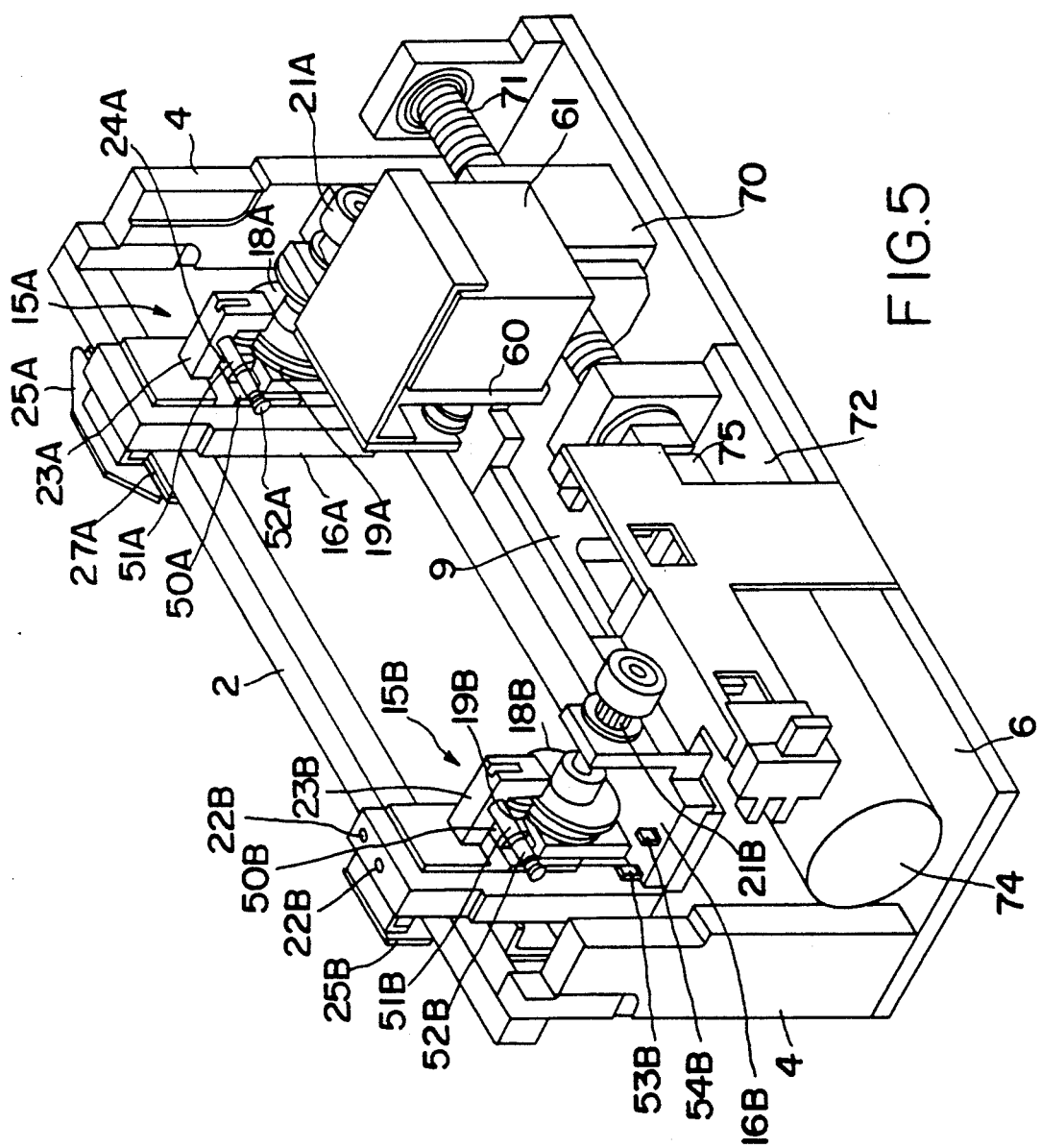
FIG. 5 is a perspective view illustrating essential elements of the apparatus of the present invention.

Respective spring attachment hooks 51A and 52A are mounted to the upper claw holder 23A and lower claw holder 24A. Springs (not shown) are installed between spring attachment hooks 51A and 54A and between spring attachment hooks 52A and 53A and 52B. The hooks 53A and 54A are provided on the supporting block 16A (since hooks 53a and 54A are not shown in the drawings, see FIG. 5 for the hooks 51B and 54B and hooks 52B and 53B for the relationship between the hooks with springs installed thereon). As a result, the rollers 47A and 48A are respectively pressed against the upper claw up/down cam 18A and lower claw up/down cam 19A.

A sensor 55A is provided on the supporting block 16A. The sensor 55A is positioned so as to correspond to the starting point detection cam 20A.

A motor supporting plate 60 is provided on the surface of the slider 9 between the two frame feeding assemblies 15A and 15B. A claw open/close motor 61 is provided on the motor supporting plate 60, and a timing pulley 62 is attached to the output shaft of the claw open/close motor 61.

A timing belt 63 is installed on the timing pulley 62 and between the timing pulleys 21A and 21B of the frame feeder assemblies 15A and 15B. In order to apply tension to the timing belt 63, roller supporting plates 64 and 65 are fixed to the motor supporting plate 60 and tension rollers 66 and 67 are rotatably provided on the roller supporting plates 64 and 65. These tension rollers 66 and 67 are caused to press against the timing belt 63.

A female screw or moving piece 70 is provided on the slider 9. A male screw or drive shaft 71 which is parallel to the guide rail 2 is screw-engaged with the female screw (moving piece) 70. The male screw (drive shaft) 71 is rotatable between supporting plate 73 and screw supporter 72a of a U-shaped supporting plate 72. The supporting plates 72 and 73 are fastened to the base plate 6. A claw moving motor 74 is mounted on the motor support 72b of the supporting plate 72, and the output shaft of the claw moving motor 74 is connected to the male screw 71 via a coupling 75.

The operation of the above feeding apparatus will be described below. Description will made on and in the order of the claw open/close mechanism, the claw driving mechanism and then the lead frame feeding operation.

First, the operation of the claw open/close mechanism which opens and closes the upper claws 25A and 25B and lower claws 27A and 27B will be described.

The rising profiles of the upper claw up/down cams 18A and 18B and lower claw up/down cams 19A and 19B cause the corresponding upper claw holders 23A and 23B and lower claw holders 24A and 24B to rise, and as a result, the upper claws 25A and 25B and lower claws 27A and 27B are raised.

Conversely, the lowering profiles of the upper claw up/down cams 19A and 19B cause the corresponding upper claw holders 23A and 23B and lower claw holders 24A and 24B to drop. As a result, the upper claws 25A and 25B and lower claws 27A and 27B are lowered.

Here, the description of operation will begin with a state in which the right side claws consisting of the upper claw 25A and lower claw 27A (called "right side claws") are closed, and the left side claws consisting of the upper claw 25B and the lower claw 27B (called "left side claws") are open.

When the claw open/close motor 61 is rotated, the cam shafts 17A and 17B, upper claw up/down cams 18A and 18B and lower claw up/down cams 19A and 19B are rotated via the timing pulley 62, timing belt 63 and timing pulleys 21A and 21B.

When the cam shafts 17A and 17B rotate 90 degrees, the upper claw 25A is raised by the rising profile of the upper claw up/down cam 18A, and the lower claw 27A is lowered by the lowering profile of the lower claw up/down cam 19A. As a result, the right side claws 25A and 27A are opened.

However, since the profiles of the upper claw up/down cam 18B and lower claw up/down cam 19B are unchanged, the left side claws 25B and 27B remain open.

When the cam shafts 17A and 17B rotate another 90 degrees under this state, the profiles of the upper claw up/down cam 18A and lower claw up/down cam 19A are unchanged so that the right side claws 25A and 27A remain open; but the left side claws 25B and 27B are closed by the rising profile of the upper claw up/down cam 18B and the lowering profile of the lower claw up/down cam 19B.

If the cam shafts 17A and 17B rotate yet another 90 degrees, the right side claws 25A and 27A are closed by the lowering profile of the upper claw up/down cam 18A and the rising profile of the lower claw up/down cam 19A; but the profiles of the upper claw up/down cam 18B and lower claw up/down cam 19B are unchanged; thus, the left side claws 25B and 27B remain closed.

When the cam shafts 17A and 17B rotate still another 90 degrees, the profiles of the upper claw up/down cam 18A and lower claw up/down cam 19A are unchanged, and the right side claws 25A and 27A remain closed; but the left side claws 25B and 27B are opened by the rising profile of the upper claw up/down cam 18B and the dropping profile of the lower claw up/down cam 19B.

As seen from the above, when the cam shafts 17A and 17B are rotated 90 degrees, 180 degrees, 270 degrees and 360 degrees, the right side claws 25A and 27A are "open, open, closed and closed", while the left hand claws 25B and 27B are "open, closed, closed and open".

Next, the operation of the claw driving mechanism which moves the upper claws 25A and 25B and lower claws 27A and 27B, i.e., the frame feeder assemblies 15A and 15B, will be described.

When the claw moving motor 74 rotates in the forward direction, the male screw (drive shaft) 71 is rotated via the coupling 75. As a result, the female screw (moving piece) 70, which is screw-engaged with the drive shaft 71, moves to the left in FIG. 1 (as indicated by the solid line) from the position indicated by the broken line. Since the slider 9 is attached to this female screw 70, the slider 9 also moves to the left.

The supporting blocks 16A and 16B of the frame feeder assemblies 15A and 15B are mounted to the slider 9; as a result, the frame feeder assemblies 15A and 15B (therefore, the upper and lower claws 25A and 27A and the upper and lower claws 25B and 27B) also move to the left as the slider 9 moves to the left as described above.

Conversely, when the claw moving motor 74 rotates in the reverse direction, the female screw 70, slider 9 and frame feeder assemblies 15A and 15B move to the right. As a result, the upper and lower claws 25A and 27A and the upper and lower claws 25B and 27B also move to the right.

The frame feeding operation will be described below.

First, when the claw open/close motor 61 is caused to rotate 90 degrees with the right side claws 25A and 27A closed and the left side claws 25B and 27B open, the upper claw up/down cam 18A and upper claw up/down cam 18B rotate 90 degrees as described above. As a result, the right side claws 25A and 27A are opened and the left side claws 25B and 27B remain open. In other words, the right side claws 25A and 27A and left side claws 25B and 27B are both open at this point.

Next, the claw moving motor 74 is caused to rotate by a fixed amount in the forward direction, and the slider 9 and frame feeder assembly 15A and 15B move a fixed distance to the left as described above. As a result, the right side claws 25A and 27A and left side claws 25B and 27B are positioned where they can chuck the lead frame 1.

If the claw open/close motor 61 is again caused to rotate 90 degrees, the right side claws 25A and 27A are in an open state and the left side claws 25B and 27B are in a closed state (as described above). As a result, the left side claws 25B and 27B chuck the lead frame 1 on the entrance side of the guide rails 2 and 3.

Next, the claw moving motor 74 is driven in reverse by an amount equal to one-third of the amount of forward rotation. As a result, the left side claws 25B and 27B (while still chucking the entrance side lead frame) move a fixed distance to the right (i.e., a distance that corresponds to one device on the lead frame 1). In other words, the entrance side lead frame is fed to the right by an amount corresponding to one device.

However, since the right side claws 25A and 27A are in an open state, the exit side lead frame is not fed. As a result, the entrance side lead frame is moved one pitch closer to the exit side lead frame, and the entrance side lead frame is fed by one pitch while (for example) bonding is performed on the exit side lead frame.

Next, after (for example) bonding is completed on the exit side lead frame, the claw open/close motor 61 is again caused to rotate 90 degrees. This causes the right side claws 25A and 27A and left side claws 25B and 27B to be both closed (as described above). As a result, the left side claws 25B and 27B keep chucking the lead frame on the entrance side of the guide rails 2 and 3, and the right side claws 25A and 27A chuck the exit side lead frame.

Next, the claw moving motor 74 is again driven in the reverse direction by an amount equal to one-third of the amount of the forward rotation. As a result, the right side claws 25A and 27A and left side claws 25B and 27B move a fixed distance to the right (i.e., a distance that corresponds to one device) while still chucking the exit side and entrance side lead frames, respectively. In other words, the exit side and entrance side lead frames are both fed to the right by an amount corresponding to one device or one frame.

Then, after bonding of the exit side lead frame is completed, the claw open/close motor 61 is again caused to rotate 90 degrees, so that the right side claws 25A and 27A are closed and the left side claws 25B and 27B are opened (as described above). Then, the claw moving motor 74 is again driven reversely by an amount equal to the remaining third of the forward rotation. As a result, the right side claws 25A and 27A move a fixed distance to the right while continuing to chuck the exit side lead frame. In other words, the exit side lead frame is fed to the right by an amount that corresponds to one device. However, since the left side claws 25A and 27B remain open, the entrance side lead frame is not fed.

By repeating the actions described above, an entrance side lead frame is first fed by an amount corresponding to one device (that is, one lead frame length), entrance side and exit side lead frames are fed by an amount equal to one device, and then the exit side lead frame is fed by an amount equal to one device.

In the above embodiment, both the upper claws 25A an 25B and lower claws 27B and 27B are opened and closed by the claw open/close mechanism. However, it is possible to design such that only the upper claws 25A and 25B open and close and the lower claws 27A and 27B do not, or only the lower claws 27A and 27B open and close and the upper claws 25A and 25B do not.

In the embodiment described above, the opening and closing of the upper claws 25A and 25B and lower claws 26A and 27B is accomplished by the claw open/close motor 61. However, a solenoid or an air cylinder, etc. can be used instead. Moreover, instead of using the upper claws 25A and 25B and lower claws 27A and 27B to chuck and feed lead frames, it is possible to form pins (which fit into feed holes of the lead frames) on one set of claws, that is, for example, the upper claws 25A and 25B.

In addition, though in the above embodiment two frame feeder assemblies 15A and 15B are used, three or more frame feeder assemblies can be used.

Furthermore, in the described embodiment, the entrance side lead frame is first fed by an amount corresponding to one device (or one lead frame length) and then both the entrance side and exit side lead frames are fed by an amount corresponding to one device, and finally, the exit side lead frame alone is fed by an amount corresponding to one device. It is of course possible to arrange the apparatus so that both the exit side and entrance side lead frames are constantly fed (in an intermittent manner) by the amount corresponding to one device. In this case, a microcomputer, for example, is used to determine whether lead frames which are not to be bonded are fed or not during a bonding operation depending upon the relationship between lead frame feeding time and bonding time. The microcomputer then outputs commands for the open/close and feeding actions of the right side claws and left side claws.

As described above, since the frame feeder assemblies 15A and 15B are provided on the slider 9 and the female screw (moving piece) 70 is attached to the slider 9, the length of the male screw (drive shaft) 71 which moves the female screw (moving piece) 70 need only be as long as a fixed distance which the frame feeder assemblies 15A and 15B are moved, i.e., one feeding pitch for a plate-form part to be fed.

In other words, the length of the male screw (drive shaft) can be extremely short, and only one female screw (moving piece) is required. Accordingly, the claw-driving mechanism can be compact, and the male screw (drive shaft) can be manufactured inexpensively with high precision. Thus, the respective frame feeder assembly can be moved with high precision and bonding can be performed highly efficiently.

We claim:

1. An apparatus for feeding plate-form parts characterized in that said apparatus comprises: a plurality of frame feeder assemblies which have claws that are used to feed plate-form parts, a base, a single slider slidably mounted on said base, said plurality of frame feeder assemblies being mounted on said slider, a female screw which is connected to said slider, a male screw which is screw engaged with said female screw, said male screw having a length equal to a feeding pitch of one of said plate-form parts, and a claw moving motor provided on said base which rotates said male screw.

2. An apparatus according to claim 1 further comprising claw opening and closing means provided on each of said plurality of frame feeder assemblies.

* * * * *